(12) United States Patent
Tsubuku (10) Patent No.: US 9,093,543 B2
(45) Date of Patent: Jul. 28, 2015

(54) SEMICONDUCTOR DEVICE

(71) Applicant: Semiconductor Energy Laboratory Co., Ltd., Atsugi-shi, Kanagawa-ken (JP)

(72) Inventor: Masashi Tsubuku, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/521,540

(22) Filed: Oct. 23, 2014

(65) Prior Publication Data

US 2015/0041819 A1     Feb. 12, 2015

Related U.S. Application Data

(62) Division of application No. 13/687,461, filed on Nov. 28, 2012, now Pat. No. 8,872,179.

(30) Foreign Application Priority Data

Nov. 30, 2011   (JP) .................................. 2011-262234

(51) Int. Cl.
*H01L 29/04*        (2006.01)
*H01L 29/786*       (2006.01)
(Continued)

(52) U.S. Cl.
CPC ........ *H01L 29/7869* (2013.01); *H01L 29/1033* (2013.01); *H01L 29/42384* (2013.01); *H01L 29/78693* (2013.01); *H01L 2029/42388* (2013.01)

(58) Field of Classification Search
CPC .............. H01L 29/04; H01L 29/66757; H01L 69/66765; H01L 29/78696; H01L 31/20; H01L 31/036; H01L 31/0376; H01L 21/775

USPC ................................. 257/43, 57, 59, E33.053
See application file for complete search history.

(56) References Cited

U.S. PATENT DOCUMENTS 5,731,856 A    3/1998   Kim et al.
5,744,864 A    4/1998   Cillessen et al.
(Continued)

FOREIGN PATENT DOCUMENTS

EP    1737044 A    12/2006
EP    2226847 A    9/2010
(Continued)

OTHER PUBLICATIONS

Asakuma.N. et al., "Crystallization and Reduction of Sol-Gel-Derived Zinc Oxide Films by Irradiation With Ultraviolet Lamp", Journal of sol-gel Science and Technology, 2003, vol. 26, pp. 181-184.

(Continued)

*Primary Examiner* — Phuc Dang
(74) *Attorney, Agent, or Firm* — Fish & Richardson P.C.

(57) ABSTRACT

To improve switching characteristics of a transistor in which a channel is formed in an oxide semiconductor layer. A parasitic channel is formed at an end portion of the oxide semiconductor layer because a source and a drain of the transistor are electrically connected to the end portion. That is, when at least one of the source and the drain of the transistor is not electrically connected to the end portion, the parasitic channel is not formed at the end portion. In view of this, a transistor having a structure in which at least one of a source and a drain of the transistor is not or less likely to be electrically connected to an end portion of an oxide semiconductor layer is provided.

14 Claims, 7 Drawing Sheets

(51) Int. Cl.
*H01L 29/10* (2006.01)
*H01L 29/423* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,348,598 B2 | 3/2008 | Oana |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,537,976 B2 | 5/2009 | Hirose |
| 7,674,650 B2 | 3/2010 | Akimoto et al. |
| 7,732,819 B2 | 6/2010 | Akimoto et al. |
| 7,772,598 B2 | 8/2010 | Choi et al. |
| 7,932,521 B2 | 4/2011 | Akimoto et al. |
| 8,274,077 B2 | 9/2012 | Akimoto et al. |
| 8,445,903 B2 | 5/2013 | Inoue et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0056847 A1 | 3/2005 | Nakamura et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1* | 10/2008 | Kim et al. .................. 257/43 |
| 2008/0272370 A1 | 11/2008 | Endo et al. |
| 2008/0296568 A1 | 12/2008 | Ryu et al. |
| 2008/0308796 A1 | 12/2008 | Akimoto et al. |
| 2008/0308803 A1 | 12/2008 | Kim |
| 2008/0308805 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2009/0321731 A1* | 12/2009 | Jeong et al. .................. 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2011/0042670 A1* | 2/2011 | Sato et al. .................. 257/43 |
| 2011/0068852 A1 | 3/2011 | Yamazaki et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |
| 2012/0001167 A1 | 1/2012 | Morosawa |
| 2013/0078760 A1 | 3/2013 | Tsang |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-310636 A | 11/2006 |
| JP | 2006-352087 A | 12/2006 |
| JP | 2007-096055 A | 4/2007 |
| JP | 2007-123861 A | 5/2007 |
| JP | 2007-201476 A | 8/2007 |
| JP | 2011-091382 A | 5/2011 |
| WO | WO-2004/114391 | 12/2004 |

(56) References Cited

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc—Indium—Oxide Thin Film Transistors for AMOLED Back-Plane", SID DIgest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc—Oxide Thin-Film Transistors (ZnO TFTS) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High performance TFT", SIS Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID DIgest '08 : SID International Symposium Digest of Technical Papers, May 20, 2008, vol. 39, pp. 1277-1280.

Ikeda.T et al., "Full-Functional System Liquid Crystal Display Using CG-Silicon technology", SID DIgest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc—Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SIS Sigest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YBFE2O4, and YB2FE3O7 Types of Structures for Compounds in the In2O3 and Sc2O3—A2O3-Bo Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7,8,9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crysalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for WhiteTandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papes, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM '09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th Intenational Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

SEMICONDUCTOR DEVICE

CROSS-REFERENCE TO RELATED APPLICATIONS

This application is a divisional of U.S. application Ser. No. 13/687,461, filed Nov. 28, 2012, now U.S. Pat. No. 8,872,179, which claims the benefit of a foreign priority application filed in Japan as Serial No. 2011-262234 on Nov. 30, 2011, both of which are incorporated by reference.

BACKGROUND OF THE INVENTION

1. Field of the Invention

The present invention relates to a transistor, in particular, a transistor in which a channel is formed in an oxide semiconductor layer. Further, the present invention relates to a semiconductor device including the transistor, for example, an active matrix display device including the transistor in each pixel. Note that in this specification, a semiconductor device refers to any device that operates by utilizing semiconductor characteristics.

2. Description of the Related Art

In recent years, a metal oxide having semiconductor characteristics, which is called an oxide semiconductor, has attracted attention as a material of a transistor. Metal oxides are used for a variety of applications. For example, indium oxide is used as a material of a pixel electrode in a liquid crystal display device. Examples of such metal oxides having semiconductor characteristics include tungsten oxide, tin oxide, indium oxide, and zinc oxide, and transistors in each of which a channel is formed using such a metal oxide layer having semiconductor characteristics have been known (Patent Documents 1 and 2).

REFERENCE

Patent Document

[Patent Document 1] Japanese Published Patent Application No. 2007-123861
[Patent Document 2] Japanese Published Patent Application No. 2007-096055

SUMMARY OF THE INVENTION

Electric characteristics of a transistor in which a channel is formed in an oxide semiconductor layer might change due to processing conditions or heat treatment conditions. It can be considered that this change is caused by entry of a resistance-reducing element (chlorine (Cl), fluorine (F), boron (B), hydrogen (H), or the like) in a formation step of the oxide semiconductor layer or desorption of oxygen (O) from the oxide semiconductor layer. Further, it has been found that this change tends to be obvious at an end portion of the oxide semiconductor layer. In other words, it has been found that in the transistor in which the channel is formed in the oxide semiconductor layer, the end portion of the oxide semiconductor layer becomes a low-resistance region, and a parasitic channel of the transistor is likely to be formed in the region. Note that the transistor has a possibility that two kinds of channels are formed: a channel (also referred to as a first channel) and the parasitic channel (also referred to as a second channel) formed depending on a voltage between a gate and a source.

In the transistor having a possibility that two kinds of channels are formed, the threshold voltage between the gate and the source at which the channel is formed differs between the two channels in many cases. Typically, the threshold voltage at which the first channel is formed is higher than the threshold voltage at which the second channel is formed. The current drive capability of the first channel is higher than that of the second channel. Thus, in the case where the voltage between the gate and the source of the transistor in an off state is increased, a current between the source and the drain changes in two stages. Specifically, a change in the first stage (an increase in the current between the source and the drain) is found in the vicinity of the threshold voltage at which the second channel is formed, and further, a change in the second stage (an increase in the current between the source and the drain) is found in the vicinity of the threshold voltage at which the first channel is formed.

In a digital circuit, a transistor is used as a switch. Needless to say, an element which changes in two stages is not preferable as a switch. In view of this problem, an object of one embodiment of the present invention is to improve switching characteristics of a transistor in which a channel is formed in an oxide semiconductor layer.

A parasitic channel is formed at an end portion of the oxide semiconductor layer because a source and a drain of the transistor are electrically connected to the end portion. That is, when at least one of the source and the drain of the transistor is not electrically connected to the end portion, the parasitic channel is not formed at the end portion. Therefore, a main point of one embodiment of the present invention is to provide a transistor having a structure in which at least one of a source and a drain of the transistor is not or less likely to be electrically connected to an end portion of an oxide semiconductor layer.

For example, one embodiment of the present invention is a transistor in which at least one of a source and a drain is not in contact with an end portion of an oxide semiconductor layer. Further, in one embodiment of the present invention, a distance between at least one of the source and the drain which is not in contact with the end portion of the oxide semiconductor layer and the end portion of the oxide semiconductor layer is preferably longer than a distance between the source and the drain.

In a transistor of one embodiment of the present invention, it is possible that a source and a drain of the transistor are not or less likely to be electrically connected to each other through an end portion of an oxide semiconductor layer (a parasitic channel is not or less likely to be formed at the end portion). Thus, in the transistor, it is possible that current between the source and the drain does not change or is less likely to change in two stages depending on a voltage between a gate and the source. In other words, in one embodiment of the present invention, switching characteristics of a transistor in which a channel is formed in an oxide semiconductor layer can be improved.

DETAILED DESCRIPTION OF THE INVENTION

Embodiments of the present invention will be described below in detail. Note that the present invention is not limited to the description below, and a variety of changes can be made without departing from the spirit and scope of the present invention. Therefore, the present invention should not be construed as being limited to the description below.

<Example of Structure of Transistor>

Figure 1A:
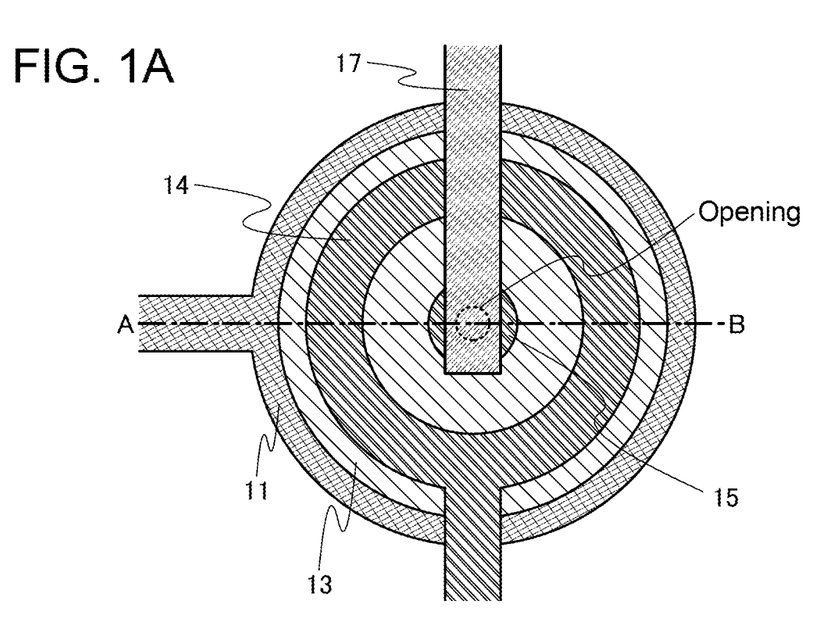
FIG. 1A is a plan view illustrating an example of a structure of a transistor and FIG. 1B is a cross-sectional view illustrating the example of the structure of the transistor.

A structure of a transistor according to one embodiment of the present invention will be described with reference to FIGS. 1A and 1B. FIG. 1A is a plan view of the transistor according to one embodiment of the present invention, and FIG. 1B is a cross-sectional view taken along line A-B in the plan view of FIG. 1A.

Figure 1B:
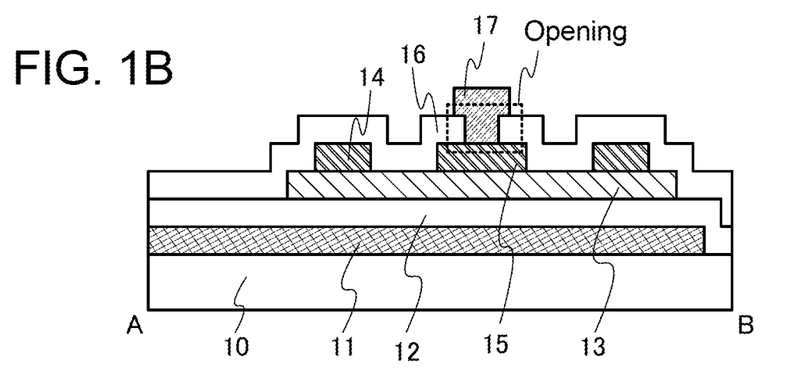

The transistor in FIGS. 1A and 1B includes a gate 11 over a substrate 10 having an insulating surface, a gate insulating layer 12 over the gate 11, an oxide semiconductor layer 13 overlapping with the gate 11 with the gate insulating layer 12 provided therebetween, and a source 14 and a drain 15 over the oxide semiconductor layer 13. Further, an insulating layer 16 and a conductive layer 17 in contact with the drain 15 in an opening provided in the insulating layer 16 are provided over the transistor. The source 14 and the drain 15 can be replaced with each other. In other words, one embodiment of the present invention is not limited to the structure where the drain 15 is surrounded by the source 14 as illustrated in FIGS. 1A and 1B, and a structure in which a source is surrounded by a drain can be employed.

In the transistor in FIGS. 1A and 1B, the concentration of resistance-reducing elements included in at least one of a region of the oxide semiconductor layer 13 which is in contact with the source 14 and a region of the oxide semiconductor layer 13 which is in contact with the drain 15 is lower than that of the resistance-reducing elements included in an end portion of the oxide semiconductor layer 13 in some cases. Examples of the resistance-reducing elements include chlorine (Cl), fluorine (F), boron (B), and hydrogen (H).

Further, in the transistor in FIGS. 1A and 1B, the concentration of oxygen included in at least one of the region of the oxide semiconductor layer 13 which is in contact with the source 14 and the region of the oxide semiconductor layer 13 which is in contact with the drain 15 is higher than that of oxygen included in the end portion of the oxide semiconductor layer 13 in some cases.

In the transistor in FIGS. 1A and 1B, neither the source 14 nor the drain 15 is in contact with the end portion of the oxide semiconductor layer 13. Specifically, in the transistor, the source 14 has a circular shape including an opening (both an inner perimeter and an outer perimeter are circular), and the drain 15 is in the opening. Thus, in the transistor in FIGS. 1A and 1B, a parasitic channel is not formed at the end portion even when the resistance of the end portion of the oxide semiconductor layer 13 is reduced. As a result, degradation of switching characteristics due to the presence of the parasitic channel is not caused in the transistor in FIGS. 1A and 1B.

The same can be applied to a transistor having the structure where one of a source and a drain surrounds the other of the source and the drain. In other words, the parasitic channel is not formed at the end portion of the oxide semiconductor layer 13 in the transistor even when the resistance of the end portion is reduced. In the transistor, an inner perimeter and an outer perimeter of the one of the source and the drain are closed curves or polygons, or part thereof is a curved line and the rest thereof is a polyline; and the other of the source and the drain is on an inner side of the one of the source and the drain.

(Substrate)

As the substrate 10 having an insulating surface, any substrate can be used as long as it has heat resistance high enough to withstand heat treatment performed later. For example, a substrate such as a glass substrate, a ceramic substrate, a quartz substrate, or a sapphire substrate can be used. A flexible substrate may alternatively be used as the substrate 10. An insulating layer can be formed over the substrate 10 in order to prevent an element contained in the substrate 10 from entering an oxide semiconductor layer to be formed later.

(Conductor)

For the gate 11, the source 14, the drain 15, and the conductive layer 17, an element selected from aluminum (Al), copper (Cu), titanium (Ti), tantalum (Ta), tungsten (W), molybdenum (Mo), chromium (Cr), neodymium (Nd), and scandium (Sc); an alloy containing any of these elements; or a nitride containing any of these elements can be used. A stacked structure of these materials can also be used.

(Insulator)

For each of the gate insulating layer 12 and the insulating layer 16, an insulator such as silicon oxide, silicon nitride, silicon oxynitride, silicon nitride oxide, aluminum oxide, or tantalum oxide can be used. A stacked structure of these materials can also be used. Note that silicon oxynitride refers to a substance which contains more oxygen than nitrogen and contains oxygen, nitrogen, silicon, and hydrogen at given concentrations ranging from 55 atomic % to 65 atomic %, 1 atomic % to 20 atomic %, 25 atomic % to 35 atomic %, and 0.1 atomic % to 10 atomic %, respectively, where the total percentage of atoms is 100 atomic %. Further, silicon nitride oxide refers to a substance which contains more nitrogen than oxygen and contains oxygen, nitrogen, silicon, and hydrogen at given concentrations ranging from 15 atomic % to 30 atomic %, 20 atomic % to 35 atomic %, 25 atomic % to 35 atomic %, and 15 atomic % to 25 atomic %, respectively, where the total percentage of atoms is 100 atomic %.

(Semiconductor)

As the oxide semiconductor layer 13, an oxide containing at least indium (In) or zinc (Zn) can be used. In particular, it is preferable to use an oxide containing indium (In) and zinc (Zn). Further, the oxide semiconductor layer 13 preferably contains gallium (Ga) as a stabilizer for reducing oxygen vacancies in the oxide semiconductor layer 13. The oxide semiconductor layer 13 may contain one or plural kinds of tin (Sn), hafnium (Hf), aluminum (Al), zirconium (Zr), and lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) as another stabilizer.

For the oxide semiconductor layer 13, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main components and there is no particular limitation on the ratio of In, Ga, and Zn. The In—Ga—Zn-based oxide may contain a metal element other than the In, Ga, and Zn.

The oxide semiconductor layer 13 is in a single crystal state, a polycrystalline (also referred to as polycrystal) state, a microcrystalline state, an amorphous state, or the like.

The oxide semiconductor layer 13 is preferably a CAAC-OS (c-axis aligned crystalline oxide semiconductor) layer.

The CAAC-OS layer is not completely single crystal nor completely amorphous. The CAAC-OS layer is an oxide semiconductor layer with a crystal-amorphous mixed phase structure where crystal parts are included in an amorphous phase. Note that in most cases, the crystal part fits inside a cube whose one side is less than 100 nm From an observation image obtained with a transmission electron microscope (TEM), a boundary between an amorphous part and a crystal part in the CAAC-OS layer is not clear. Further, with the TEM, a grain boundary in the CAAC-OS layer is not found. Thus, in the CAAC-OS layer, a reduction in electron mobility, due to the grain boundary, is suppressed.

In each of the crystal parts included in the CAAC-OS layer, a c-axis is aligned in a direction parallel to a normal vector of a surface where the CAAC-OS layer is formed or a normal vector of a surface of the CAAC-OS layer, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS layer, distribution of crystal parts is not necessarily uniform. For example, in the formation process of the CAAC-OS layer, in the case where crystal growth occurs from a surface side of the oxide semiconductor layer 13, the proportion of crystal parts in the vicinity of the surface of the oxide semiconductor film is higher than that in the vicinity of the surface where the oxide semiconductor film is formed in some cases. Further, when an impurity is added to the CAAC-OS layer, the crystal part in a region to which the impurity is added becomes amorphous in some cases.

Since the c-axes of the crystal parts included in the CAAC-OS layer are aligned in the direction parallel to a normal vector of a surface where the CAAC-OS layer is formed or a normal vector of a surface of the CAAC-OS layer, the directions of the c-axes may be different from each other depending on the shape of the CAAC-OS layer (the cross-sectional shape of the surface where the CAAC-OS layer is formed or the cross-sectional shape of the surface of the CAAC-OS layer). Note that when the CAAC-OS layer is formed, the direction of c-axis of the crystal part is the direction parallel to a normal vector of the surface where the CAAC-OS layer is formed or a normal vector of the surface of the CAAC-OS layer. The crystal part is formed by film formation or by performing treatment for crystallization such as heat treatment after film formation.

With use of the CAAC-OS layer in a transistor, change in electric characteristics of the transistor due to irradiation with visible light or ultraviolet light can be reduced. Thus, the transistor has high reliability.

Note that part of oxygen included in the oxide semiconductor layer 13 may be substituted with nitrogen.

In addition, it is preferable that the oxide semiconductor layer 13 be the one which is highly purified and hardly contains impurities such as copper (Cu), aluminum (Al), and chlorine (Cl). In the process for manufacturing the transistor, steps in which these impurities are not mixed or attached to the surface of the oxide semiconductor layer 13 are preferably selected as appropriate. In the case where the impurities are attached to the surface of the oxide semiconductor layer 13, the impurities on the surface of the oxide semiconductor layer 13 are preferably removed by exposure to phosphoric acid, oxalic acid, dilute hydrofluoric acid or plasma treatment (such as $N_2O$ plasma treatment). Specifically, the copper (Cu) concentration of the oxide semiconductor layer 13 is lower than or equal to $1 \times 10^{18}$ atoms/cm$^3$, preferably lower than or equal to $1 \times 10^{17}$ atoms/cm$^3$. In addition, the aluminum (Al) concentration of the oxide semiconductor layer 13 is lower than or equal to $1 \times 10^{18}$ atoms/cm$^3$. Further, the chlorine (Cl) concentration of the oxide semiconductor layer 13 is lower than or equal to $2 \times 10^{18}$ atoms/cm$^3$.

The oxide semiconductor layer 13 is preferably highly purified by sufficient removal of impurities such as hydrogen or sufficient supply with oxygen so as to be supersaturated with oxygen. Specifically, the hydrogen concentration of the oxide semiconductor layer 13 is lower than or equal to $5 \times 10^{19}$ atoms/cm$^3$, preferably lower than or equal to $5 \times 10^{18}$ atoms/cm$^3$, further preferably lower than or equal to $5 \times 10^{17}$ atoms/cm$^3$. Note that the above hydrogen concentration in the oxide semiconductor layer 13 is measured by secondary ion mass spectrometry (SIMS). Further, in order to sufficiently supply oxygen to supersaturate the oxide semiconductor layer 13 with oxygen, an insulating layer containing excessive oxygen (such as a $SiO_x$ layer) is provided so as to cover and be in contact with the oxide semiconductor layer 13.

In addition, the hydrogen concentration of the insulating layer containing excessive oxygen is also important because it has effect upon the characteristics of the transistor.

<Modification Examples of Transistor>

Figure 2:
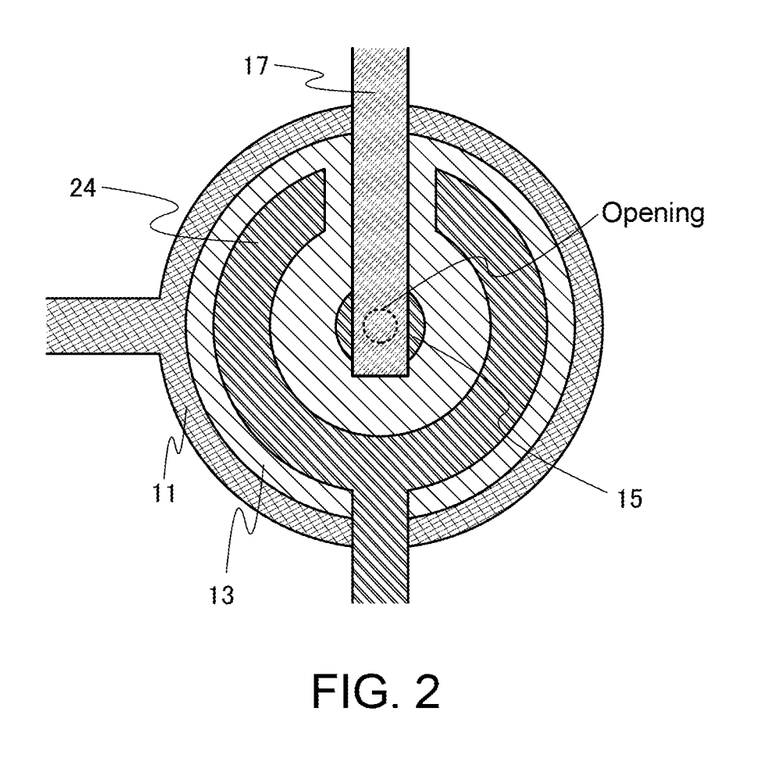
FIG. 2 is a plan view illustrating an example of a structure of a transistor.
Figure 3A:
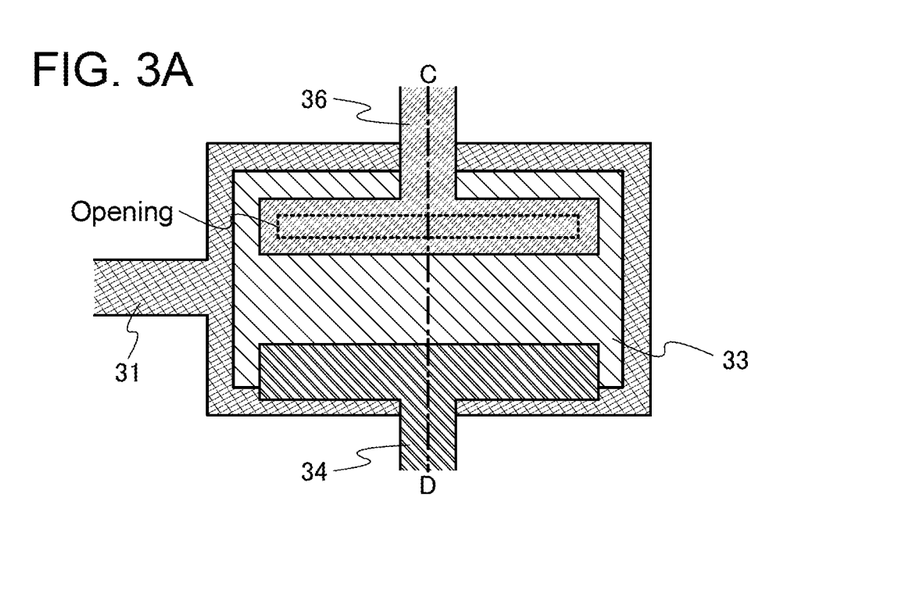
FIG. 3A is a plan view illustrating an example of a structure of a transistor and FIG. 3B is a cross-sectional view illustrating the example of the structure of the transistor.
Figure 3B:
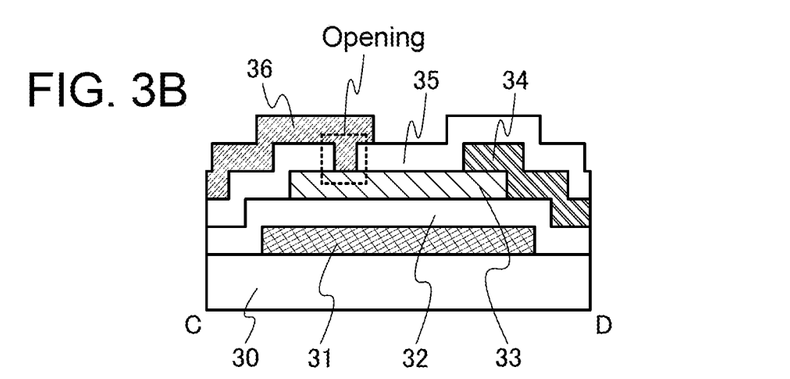

A transistor according to one embodiment of the present invention is not limited to the structure of the transistor in FIGS. 1A and 1B. For example, transistors in FIG. 2 and FIGS. 3A and 3B are also embodiments of the present invention. Note that FIG. 2 and FIG. 3A are plan views of the transistors, and FIG. 3B is a cross-sectional view taken along line C-D in the plan view of FIG. 3A.

(Modification Example 1)

The transistor in FIG. 2 has a similar structure to the transistor in FIGS. 1A and 1B except that the source 14 of the transistor in FIGS. 1A and 1B is substituted with a source 24 which has a gap in a region overlapping with the conductive layer 17. The transistor in FIG. 2 has a similar effect to the transistor in FIGS. 1A and 1B and can reduce a load due to parasitic capacitance generated between the source 24 and the conductive layer 17.

The same can be applied to a transistor having a structure in which one of a source and a drain having a gap surrounds the other of the source and the drain and a conductive layer electrically connected to the other of the source and the drain is in a region where the gap is provided. In other words, a transistor the structure of which is described below has a similar effect to the transistor in FIGS. 1A and 1B and can reduce a load due to parasitic capacitance generated between the one of the source and the drain and the conductive layer. In the transistor, one of a source and a drain has a gap and a line of an inner wall and a line of an outer wall are curved lines or polylines, or part thereof is a curved line and the rest thereof is a polyline; the other of the source and the drain is on an inner side of the one of the source and the drain; and a conductive layer electrically connected to the other of the source and the drain is in a region where the gap is provided.

As the source 24, it is possible to use a conductor similar to those of the gate 11, the source 14, the drain 15, and the conductive layer 17 which are described above.

(Modification Example 2)

The transistor in FIGS. 3A and 3B includes a gate 31 over a substrate 30 having an insulating surface, a gate insulating layer 32 over the gate 31, an oxide semiconductor layer 33 overlapping with the gate 31 with the gate insulating layer 32 provided therebetween, a source 34 over an end portion of the oxide semiconductor layer 33, and a drain 36 in contact with the oxide semiconductor layer 33 in an opening provided in an insulating layer 35 over the oxide semiconductor layer 33. In the transistor in FIGS. 3A and 3B, the drain 36 is not in contact with the end portion of the oxide semiconductor layer 33. As in the transistor in FIGS. 1A and 1B, it is possible that parasitic channel is not or less likely to be formed at the end portion of the oxide semiconductor layer 33. As a result, switching characteristics of the transistor in FIGS. 3A and 3B can be improved.

Note that the source 34 and the drain 36 can be replaced with each other. In other words, one embodiment of the present invention is not limited to the structure illustrated in FIGS. 3A and 3B, where the source 34 is provided over the end portion of the oxide semiconductor layer 33 and the drain 36 is in contact with the oxide semiconductor layer 33 in the opening provided in the insulating layer 35; a structure where a source is in contact with the oxide semiconductor layer 33 in the opening provided in the insulating layer 35 and a drain is provided over the end portion of the oxide semiconductor layer 33 can be employed.

As the substrate 30, a substrate similar to the above-described substrate 10 can be used. Further, a conductor similar to those of the gate 11, the source 14, the drain 15, and the conductive layer 17 which are described above can be used as each of the gate 31, the source 34, and the drain 36. As each of the gate insulating layer 32 and the insulating layer 35, it is possible to use an insulator similar to those of the gate insulating layer 12 and the insulating layer 16 which are described above. Further, a semiconductor similar to that of the above-described oxide semiconductor layer 13 can be used as the oxide semiconductor layer 33.

<Application Example>

The above-described transistor can be applied to an element forming any of a variety of semiconductor devices. For example, the transistor can be used as a transistor provided in each pixel in an active matrix display device. An active matrix liquid crystal display device will be described below with reference to FIGS. 4A to 4C.

Figure 4A:
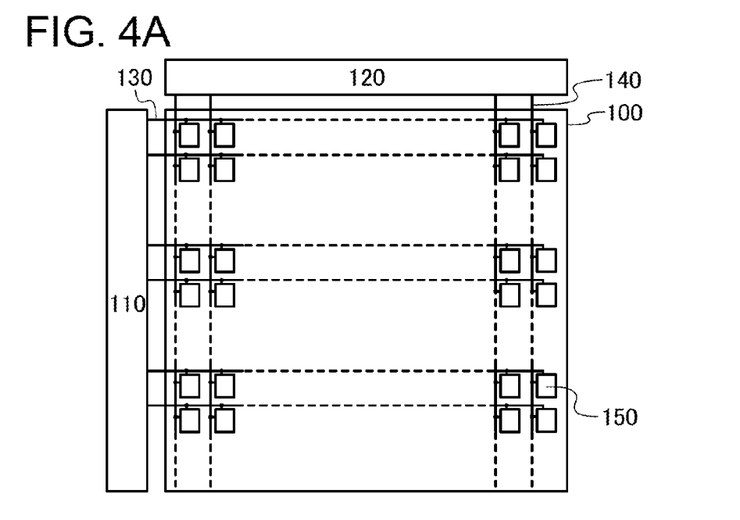
FIG. 4A illustrates an example of a structure of a liquid crystal display device.

FIG. 4A illustrates an example of a structure of a liquid crystal display device. The liquid crystal display device in FIG. 4A includes a pixel portion 100, a scan line driver circuit 110, a signal line driver circuit 120, m scan lines 130 which are provided in parallel or substantially parallel to each other and whose potentials are controlled by the scan line driver circuit 110, and n signal lines 140 which are provided in parallel or substantially parallel to each other and whose potentials are controlled by the signal line driver circuit 120. In addition, the pixel portion 100 includes a plurality of pixels 150 arranged in a matrix. Each of the scan lines 130 is electrically connected to the n pixels 150 in the corresponding row, among the plurality of pixels 150 arranged in m rows and n columns in the pixel portion 100. Each of the signal lines 140 is electrically connected to the m pixels 150 in the corresponding column, among the plurality of pixels 150 arranged in the m rows and the n columns.

Figure 4B:
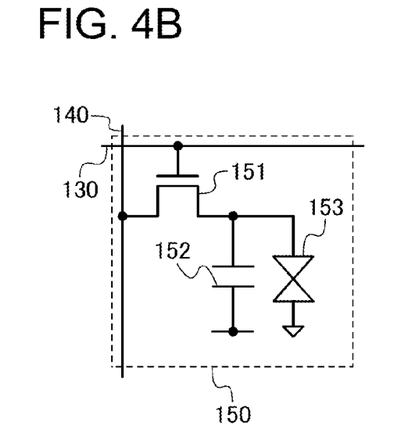
FIG. 4B illustrates an example of a structure of a pixel.

FIG. 4B illustrates an example of a circuit configuration of the pixel 150 included in the liquid crystal display device illustrated in FIG. 4A. The pixel 150 in FIG. 4B includes a transistor 151, a capacitor 152, and a liquid crystal element 153. A gate of the transistor 151 is electrically connected to the scan line 130, and one of a source and a drain of the transistor 151 is electrically connected to the signal line 140. One of electrodes of the capacitor 152 is electrically connected to the other of the source and the drain of the transistor 151, and the other of the electrodes of the capacitor 152 is electrically connected to a wiring for supplying a capacitor potential (the wiring is also referred to as a capacitor wiring). One of electrodes of the liquid crystal element 153 is electrically connected to the other of the source and the drain of the transistor 151 and the one of the electrodes of the capacitor 152, and the other of the electrodes of the liquid crystal element 153 is electrically connected to a wiring for supplying a common potential (the wiring is also referred to as a common potential line). The capacitor potential and the common potential can be the same potential.

Figure 4C:
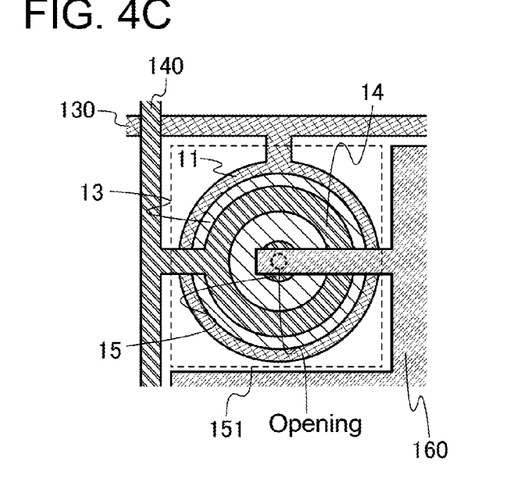
FIG. 4C illustrates an example of a structure of a transistor including the pixel.

The above-described transistor can be used as the transistor 151 in FIG. 4B. FIG. 4C is a plan view illustrating an example of a structure in the case where the transistor in FIGS. 1A and 1B is used as the transistor 151. In the transistor 151 in FIG. 4C, the gate 11 is electrically connected to the scan line 130, the source 14 is electrically connected to the signal line 140, and the drain 15 is electrically connected to a transparent conductive layer 160. In the transistor 151 in FIG. 4C, the gate 11 and the source 14 can be expressed as part of the scan line 130 and part of the signal line 140, respectively.

FIGS. 4A to 4C illustrate a liquid crystal display device including the above-described transistor in a pixel; however, the transistor can also be used as an element included in the scan line driver circuit 110 in FIG. 4A.

Further, the above-described transistor can also be used as an element included in a pixel in a display device (also referred to as an organic EL display device) which performs display by utilizing organic electroluminescence (EL).

EXAMPLE

In this example, a transistor according to one embodiment of the present invention will be described. Specifically, the transistor in FIGS. 1A and 1B is manufactured and evaluation results of characteristics of the transistor are described.

<Manufacturing Process>

A manufacturing process of the transistor is described.

First, a base layer of the transistor was formed. Specifically, a stacked film of a silicon nitride (SiN) film with a thickness of 100 nm over a glass substrate and a silicon oxynitride film with a thickness of 150 nm over the silicon nitride (SiN) film was formed by a plasma CVD method.

Next, a surface of the base layer was cleaned with hydrogen fluoride (HF).

Next, a gate was formed. Specifically, a tungsten (W) film with a thickness of 100 nm was formed over the base layer by a sputtering method. Then, the tungsten (W) film was processed by a photolithography method, so that the gate was formed.

Next, a gate insulating layer was formed. Specifically, a silicon oxynitride (SiON) film with a thickness of 100 nm was formed over the base layer and the gate by a microwave CVD method.

Next, an oxide semiconductor layer was formed. Specifically, a film containing at least indium (In), gallium (Ga), zinc (Zn), and oxygen (O) with a thickness of 35 nm was formed over the gate insulating layer by a sputtering method. Then, the film was processed by a photolithography method, so that the oxide semiconductor layer was formed.

Next, heat treatment was performed at 350° C. for an hour in a nitrogen ($N_2$) atmosphere, and then heat treatment was performed at 350° C. for an hour in a mixed atmosphere of nitrogen ($N_2$) and oxygen ($O_2$).

Next, a source and a drain were formed. Specifically, a stacked film of a 100-nm-thick titanium (Ti) film, a 400-nm-thick aluminum (Al) film over the titanium (Ti) film, and a 100-nm-thick titanium (Ti) film over the aluminum (Al) film was formed over the gate insulating layer and the oxide semiconductor layer by a sputtering method. Then, the stacked film was processed by a photolithography method, so that the source and the drain were formed.

Next, heat treatment was performed at 300° C. for an hour in a mixed atmosphere of nitrogen ($N_2$) and oxygen ($O_2$).

Next, nitrous oxide ($N_2O$) plasma treatment was performed at 220° C. for 120 seconds.

Next, an insulating layer was formed. Specifically, a silicon oxynitride (SiON) film with a thickness of 600 nm was formed over the gate insulating layer, the oxide semiconductor layer, the source, and the drain by a plasma CVD method.

Next, heat treatment was performed at 300° C. for an hour in a mixed atmosphere of nitrogen ($N_2$) and oxygen ($O_2$).

Next, after an acrylic film with a thickness of 1500 nm was formed over the insulating layer, the acrylic film was baked by performing heat treatment at 250° C. for an hour in a nitrogen ($N_2$) atmosphere.

Next, a transparent conductive layer was formed. Specifically, a film containing at least indium (In), tin (Sn), silicon (Si), and oxygen (O) was formed over the acrylic film by a sputtering method. Note that an opening was provided in the insulating layer and the acrylic film over the drain in advance to contact the film to the drain.

Lastly, heat treatment was performed at 250° C. for an hour in a nitrogen ($N_2$) atmosphere.

<Electric Characteristics>

A positive gate BT test under light irradiation conditions was performed on the transistor obtained through the above-described process. Note that in this example, a positive gate BT test refers to a test in which a voltage between a gate and a source is kept at 30 V at 80° C. for a certain period. In this example, a plurality of the above-described transistors was prepared, and the tests were performed on the transistors for respective periods less than or equal to 2000 seconds.

Figure 5:
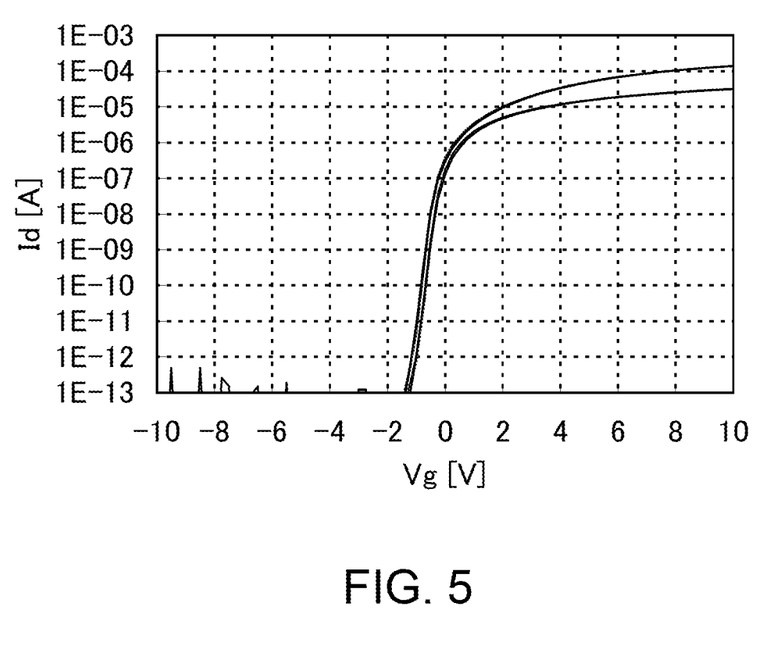
FIG. 5 is a graph showing Vg-Id curves of transistors.

FIG. 5 is a graph showing Vg-Id curves of the transistors according to this example after the tests. FIG. 5 shows that the transistors according to this example do not have large variation in switching characteristics even after the tests.

Comparative Example

A transistor whose source and drain are in contact with an end portion of an oxide semiconductor layer is described below as a comparative example.

Figure 6:
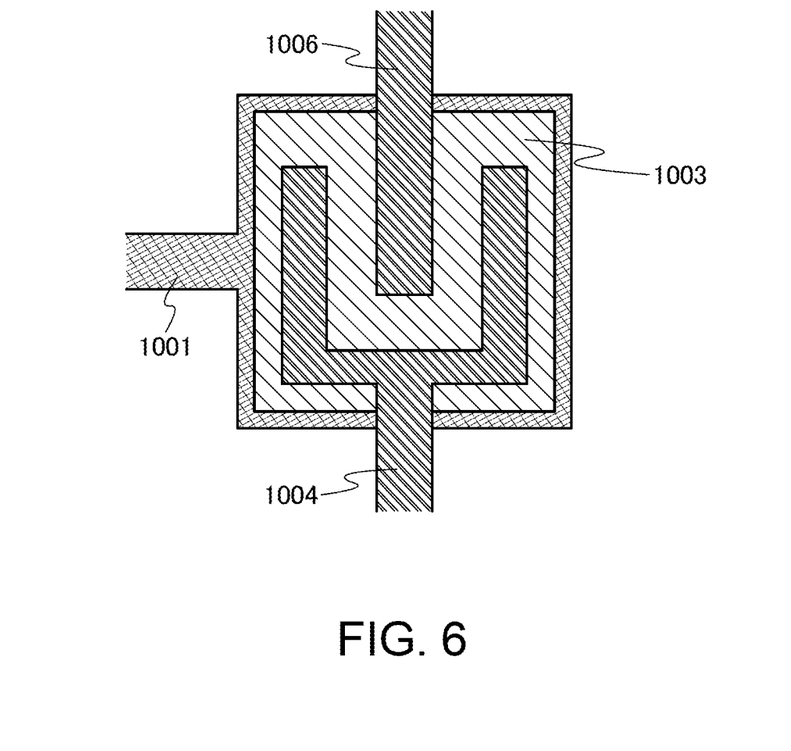
FIG. 6 is a plan view illustrating an example of a structure of a transistor.

FIG. 6 is a plan view illustrating a structure of the transistor according to this comparative example. The transistor in FIG. 6 includes a gate 1001, a gate insulating layer over the gate 1001, an oxide semiconductor layer 1003 over the gate insulating layer, and a source 1004 and a drain 1006 over the oxide semiconductor layer 1003. The source 1004 and the drain 1006 are in contact with an end portion of the oxide semiconductor layer 1003 in FIG. 6.

The transistor according to this comparative example was formed using a material and a manufacturing process similar to those of components of the transistor according to the above example. A plurality of the transistors according to this comparative example was prepared, and positive gate BT tests under light irradiation conditions were performed on the transistors for respective periods less than or equal to 2000 seconds.

Figure 7:
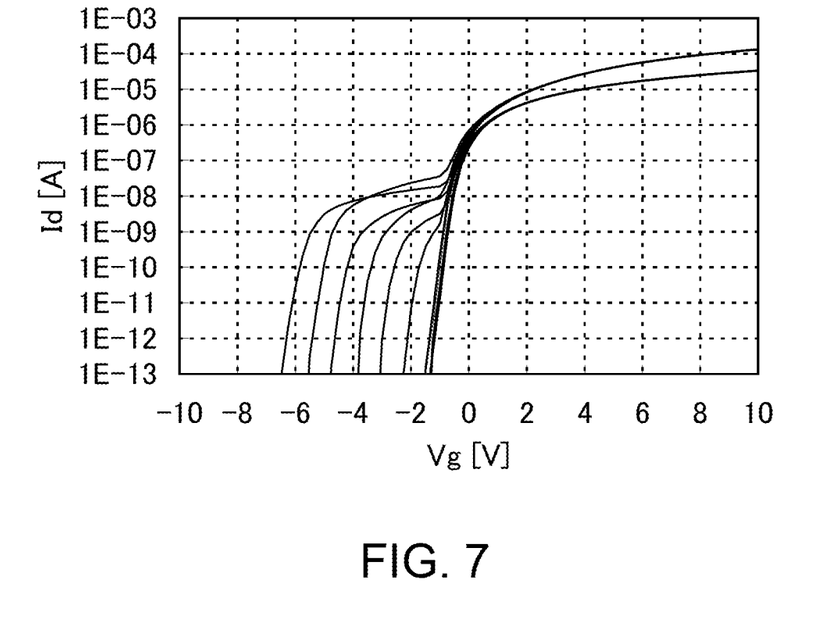
FIG. 7 is a graph showing Vg-Id curves of transistors.

FIG. 7 is a graph showing Vg-Id curves of the transistors according to this comparative example after the tests. FIG. 7 shows that the transistors according to this comparative example have large variation in switching characteristics after the tests.

This application is based on Japanese Patent Application serial no. 2011-262234 filed with Japan Patent Office on Nov. 30, 2011, the entire contents of which are hereby incorporated by reference.

What is claimed is:

1. A semiconductor device comprising:
a gate over a substrate;
a gate insulating layer over the gate;
an oxide semiconductor layer comprising a first portion and a second portion, over the gate insulating layer, wherein the first portion is an end portion, and wherein the second portion is a portion except the end portion; and
a first conductive layer and a second conductive layer over the oxide semiconductor layer,
wherein the first conductive layer is not in contact with the first portion and is in contact with the second portion,
wherein the second conductive layer is in contact with the first portion and is not in contact with the second portion,
wherein a concentration of a resistance-reducing element of the second portion is lower than a concentration of the resistance-reducing element of the first portion, and
wherein a concentration of oxygen of the second portion is higher than a concentration of oxygen of the first portion.

2. The semiconductor device according to claim 1, wherein the first portion and the second portion comprise a crystal portion.

3. The semiconductor device according to claim 1, wherein the gate, the oxide semiconductor layer, the first conductive layer, and the second conductive layer have a circular shape.

4. The semiconductor device according to claim 1, wherein the gate, the oxide semiconductor layer, the first conductive layer, and the second conductive layer have a polygonal shape.

5. The semiconductor device according to claim 1, wherein a concentration of hydrogen in the oxide semiconductor layer is lower than or equal to $5 \times 10^{19}$ atoms/cm$^3$.

6. The semiconductor device according to claim 1, wherein the oxide semiconductor layer comprises at least one of indium and zinc.

7. The semiconductor device according to claim 1, wherein a width of the gate is larger than a width of the oxide semiconductor layer in a channel length direction.

8. A semiconductor device comprising:
a gate over a substrate;
a gate insulating layer over the gate;
an oxide semiconductor layer comprising a first portion and a second portion, over the gate insulating layer, wherein the first portion is an end portion, and wherein the second portion is a portion except the end portion; and
a first conductive layer and a second conductive layer over the oxide semiconductor layer,
wherein the first conductive layer is not in contact with the first portion and is in contact with the second portion,
wherein the second conductive layer is in contact with the first portion and is not in contact with the second portion,
wherein a concentration of a resistance-reducing element of the second portion is lower than a concentration of the resistance-reducing element of the first portion,
wherein a concentration of oxygen of the second portion is higher than a concentration of oxygen of the first portion, and
wherein the resistance-reducing element is chlorine, fluorine, boron, or hydrogen.

9. The semiconductor device according to claim 8, wherein the first portion and the second portion comprise a crystal portion.

10. The semiconductor device according to claim 8, wherein the gate, the oxide semiconductor layer, the first conductive layer, and the second conductive layer have a circular shape.

11. The semiconductor device according to claim 8, wherein the gate, the oxide semiconductor layer, the first conductive layer, and the second conductive layer have a polygonal shape.

12. The semiconductor device according to claim 8, wherein a concentration of hydrogen in the oxide semiconductor layer is lower than or equal to $5 \times 10^{19}$ atoms/cm$^3$.

13. The semiconductor device according to claim 8, wherein the oxide semiconductor layer comprises at least one of indium and zinc.

14. The semiconductor device according to claim 8, wherein a width of the gate is larger than a width of the oxide semiconductor layer in a channel length direction.

* * * * *